United States Patent [19]
Kosiec et al.

[11] Patent Number: 5,497,126
[45] Date of Patent: Mar. 5, 1996

[54] PHASE SYNCHRONIZATION CIRCUIT AND METHOD THEREFOR FOR A PHASE LOCKED LOOP

[75] Inventors: Jeannie H. Kosiec, Schaumburg; Steven F. Gillig, Roselle, both of Ill.

[73] Assignee: Motorola, Inc., Schaumburg, Ill.

[21] Appl. No.: 149,259

[22] Filed: Nov. 9, 1993

[51] Int. Cl.$^6$ .................................................. H03L 7/18
[52] U.S. Cl. .............................. 331/1 A; 331/16; 331/14; 331/25; 327/156; 327/157; 327/159; 455/76; 455/260; 375/376
[58] Field of Search ........................... 331/25, 1 A, 14, 331/11, 16; 328/155; 455/260, 76, 113; 327/156, 157, 159; 375/374, 376

[56] References Cited

U.S. PATENT DOCUMENTS

| | | | |
|---|---|---|---|
| 4,812,783 | 3/1989 | Honjo et al. | 331/1 A |
| 4,817,199 | 3/1989 | Wallraff | 455/260 |
| 4,841,255 | 6/1989 | Ohba et al. | 331/14 |
| 5,008,629 | 4/1991 | Ohba et al. | 328/14 |
| 5,122,678 | 6/1992 | Takeyama | 307/269 |
| 5,128,632 | 7/1992 | Erhart et al. | 331/1 A |
| 5,180,992 | 1/1993 | Akiyama | 331/11 |
| 5,202,906 | 4/1993 | Saito et al. | 331/14 |
| 5,304,954 | 4/1994 | Saito et al. | 331/1 A |
| 5,339,278 | 8/1994 | Irwin et al. | 331/16 |

OTHER PUBLICATIONS

"State–Preserving Intermittently Locked Loop (SPILL) Frequency Synthesizer for Portable Radio", IEEE Transactions on Microwave Theory and Techniques, vol. 37, No. 12, Dec. 1989, pp. 1898–1903.

*Primary Examiner*—Robert J. Pascal
*Assistant Examiner*—Arnold Kinkead
*Attorney, Agent, or Firm*—Kevin D. Kaschke

[57] ABSTRACT

An improved phase synchronization circuit (301) and method therefor for a phase locked loop (300). Each of a divided reference frequency signal (206) and a feedback signal (209) is held in a predetermined state. The divided reference frequency signal (206) is enabled responsive to the phase of a reference frequency signal (115). A phase relationship between the reference frequency signal (115) and an output frequency signal (116 or 117) is determined. The feedback signal (209) is enabled responsive to enabling the divided reference frequency signal (206) and the determined phase relationship. The present invention advantageously provides a rapid and accurate phase synchronization for the PLL (300) with minimum additional hardware and without introducing phase error into the PLL (300).

11 Claims, 6 Drawing Sheets

PHASE SYNCHRONIZATION CIRCUIT AND METHOD THEREFOR FOR A PHASE LOCKED LOOP

FIELD OF THE INVENTION

The present invention relates generally to a radio communication transceivers and, more particularly, to a phase synchronization circuit and method therefor for a phase locked loop in a radio communication transceiver.

BACKGROUND OF THE INVENTION

FIG. 1 illustrates, by example, a block diagram of a conventional radio communication transceiver 100 (hereinafter referred to as "transceiver"). The transceiver 100 enables a mobile or portable subscriber unit to communicate with a base station (not shown), for example, over radio frequency (RF) channels in a radio communication system (not shown). The base station thereafter provides communications with a landline telephone system (not shown) and other subscriber units. An example of a subscriber unit having the transceiver 100 is a cellular radiotelephone.

The transceiver 100 of FIG. 1 generally includes an antenna 101, a duplex filter 102, a receiver 103, a transmitter 105, a reference frequency signal source 107, a receive (Rx) phase locked loop (PLL) frequency synthesizer 108, a transmit (Tx) PLL frequency synthesizer 109, a processor 110, an information source 106, and an information sink 104.

The interconnection of the blocks of the transceiver 100 and operation thereof is described as follows. The antenna 101 receives a RF signal 119 from the base station for filtering by the duplex filter 102 to produce an RF received signal at line 111. The duplex filter 102 provides frequency selectivity to separate the RF received signal at line 111 and the RF transmit signal at line 113. The receiver 103 is coupled to receive the RF received signal at line 111 and operative to produce a received baseband signal at line 112 for the information sink 104. The reference frequency signal source 107 provides a reference frequency signal at line 115. The Rx PLL frequency synthesizer 108 is coupled to receive the reference frequency signal at line 115 and information on a data bus 118 and operative to produce a receiver tune signal at line 116 to tune the receiver 103 to a particular RF channel. Likewise, the Tx PLL frequency synthesizer 109 is coupled to receive the reference frequency signal at line 115 and information on the data bus 118 and operative to produce a transceiver tune signal at line 117 to tune the transmitter 105 to a particular RF channel. The processor 110 controls the operation of the Rx PLL frequency synthesizer 108, the Tx PLL frequency synthesizer 109, the receiver 103, and the transmitter 105 via the data bus 118. The information source 106 produces a baseband transmit signal at line 114. The transmitter 105 is coupled to receive the baseband transmit signal at line 114 and operative to produce the RF transmit signal at line 113. The duplex filter 102 filters the RF transmit signal at line 113 for radiation by the antenna 101 as a RF signal 120.

The RF channels in a cellular radiotelephone system, for example, include voice and signaling channels for transmitting and receiving (hereinafter referred to as "transceiving") information between the base station and the subscriber units. The voice channels are allocated for transceiving voice information. The signaling channels, also referred to as control channels, are allocated for transceiving data and signaling information. It is through these signaling channels that the subscriber units gain access to the cellular radiotelephone system and are assigned a voice channel for further communication with the landline telephone system. In cellular radiotelephone systems capable of transceiving wideband data on the signaling channels, the frequency spacing of the signaling channels may be a multiple of the frequency spacing of the voice channels.

In some cellular radiotelephone systems, the transceiver 100 and the base station intermittently transceive information therebetween on the signaling channel. One such system, for example, an interleaved data signaling method to synchronize the intermittent information. In this type of system, keeping the transceiver 100 fully powered during the entire time that the transceiver 100 is tuned to the signaling channel unnecessarily drains the transceiver's battery during those times when the information is not received. Therefore, portions of the transceiver 100 can be powered off to prolong battery life when the transceiver is not transceiving information. Further, portions of the transceiver 100 can be powered off to prolong battery life when the signal quality is good enough such that further repetition of the same information is not needed. Intermittently powering on and off, i.e. enabling and disabling, the transceiver 100 during its receive operation is called discontinuous receive (DRX) mode of operation. In the DRX mode of operation, quickly enabling and disabling the portions of transceiver 100 increases the savings in battery life.

FIG. 2 illustrates, by example, a block diagram of a conventional phase locked loop (PLL) frequency synthesizer for use in the transceiver 100 of FIG. 1. The general structure of the PLL frequency synthesizer of FIG. 2 is the same for both the Rx PLL frequency synthesizer 108 and the Tx PLL frequency synthesizer 109.

The PLL frequency synthesizer 108 or 109 of FIG. 2 generally includes a reference divider 201, for discussion purposes, and a PLL 212. The PLL 212 generally includes a phase detector 202, a loop filter 203, a voltage controlled oscillator 204, and a loop divider 205. The reference divider 201 receives a reference frequency signal on line 115.

The interconnection of the blocks of the PLL frequency synthesizer 108 or 109 is described as follows. The reference divider 201 is coupled to receive the reference signal at line 115 and the data bus 118 and operative to produce a divided reference frequency signal at line 206. The phase detector 202 is coupled to receive a divided reference frequency signal at line 206 and a feedback signal at line 209, and operative to produce a phase; error signal at line 207. The loop filter 203 is coupled to receive the phase error signal 207, and operative to produce a filtered signal at line 208. The voltage controlled oscillator 204 is coupled to receive the filtered signal at line 208 and operative to produce an output frequency signal at line 116 or 117. The loop divider 205 is coupled to receive the output frequency signal at line 116 or 117, and operative to produce the feedback signal at line 209. The loop divider 205 and the reference divider 201 are coupled to receive programming information at the data bus 118.

The operation of the PLL frequency synthesizer 108 or 109 of FIG. 2 is described as follows. The PLL 212 is a circuit which produces the output frequency signal at line 116 or 117 synchronized to the reference frequency signal at line 115. The output frequency signal at line 116 or 117 is synchronized or "locked" to the reference frequency signal at line 115 when the frequency of the output frequency signal at line 116 or 117 has a predetermined frequency relationship to the frequency of the reference frequency signal at line 115. Under locked conditions, the 212 PLL typically provide a constant phase difference between the reference frequency signal at line 115 and the output frequency signal at line 116 or 117. The constant phase difference may assume any desired value including zero. Should a deviation in the desired phase difference of such signals develop, i.e., should a phase error at line 207 develop due to, e.g., variation in either the frequency of the reference frequency signal at line 115 or programmable parameters of the PLL via the data bus 118, the PLL adjusts the frequency of the output frequency signal at line 116 or 117 to drive the phase error at line 207 toward the value of the constant phase difference.

The PLL frequency synthesizer 108 or 109 may be classified as belonging to one of at least two categories based on the predetermined frequency relationship of the output signal frequency at line 116 or 117 to the frequency of the reference frequency signal at line 115. The first category is classified as an "integer division" PLL frequency synthesizer wherein the relationship between the output frequency signal at line 116 or 117 and reference frequency signal at line 115 is an integer. The second category is classified as a "fractional division" PLL frequency synthesizer in which the relationship between the output frequency signal at line 116 or 117 and reference frequency signal at line 115 is a rational, non-integer number, consisting of an integer and a fraction.

PLL's are characterized by a loop bandwidth. For some applications it is desirable to vary the loop bandwidth of the PLL under certain conditions such as, for example, when the frequency of the reference frequency signal at line 115 changes or when the programmable parameters of the PLL via the data bus 118 changes. Appropriately varying the loop bandwidth advantageously provides shorter locktime, improved noise, and lower spurious signals.

There is a problem caused by phase drift when a PLL frequency synthesizer is used in the DRX mode. Since the PLL is not active during the disabled portion of the DRX mode, the phase of the VCO can drift relative to the phase of the reference frequency signal source. When the PLL is re-enabled this phase drift will be translated by the action of the PLL into a change in the VCO frequency to provide the needed phase adjustment. The PLL will require extra time to lock because this induced frequency error will also have to be eventually eliminated by the PLL action before lock can occur. If the PLL is not locked, no data can be received by the transceiver. To guarantee that the PLL is locked by the time the data is present, the transceiver would have to allow extra time for the PLL to lock by enabling the PLL early. However, then the PLL would have to be enabled, and thereby consume power which would lower battery life, before any data was present to be received.

One solution, provided by the prior art, is to minimize the phase drift by using two phase locked loops. After enabling the main PLL functional blocks, but prior to closing the loop in the main PLL, a secondary PLL was activated which phase locked the reference frequency signal source to the main PLL VCO. Once the reference frequency signal source was locked to the main PLL VCO, the secondary PLL was disconnected and the loop in the main PLL was closed. This solution does provide a fast lock time for the main PLL, however, a disadvantage of this solution is the significant additional hardware for the secondary PLL to phase lock the reference frequency signal source to the main PLL VCO. In addition, the phase characteristics of both loops must be identical or a phase error can still exist in the main PLL at the time that its loop is closed.

Another solution, provided by the prior art, is to modify the value of the loop divider for its first complete divide cycle after it has been re-enabled. The second and subsequent divide cycles use the nominal divide value. A disadvantage of this solution is that it requires an independent feedback processor to adjust the first cycle divider value as environmental conditions change since one value will not be optimum for all conditions of supply and temperature.

Yet another solution, provided by the prior art, is to reset the reference divider and loop divider after they have been re-enabled but before closing the loop in the PLL. A disadvantage of this solution is that it does not provide accurate correction for the phase drift of the VCO relative to the reference frequency signal source when the PLL was disabled. Therefore the PLL will require extra time to lock because of the inaccurate phase correction.

Yet another solution, provided by the prior art, is to use the output of the phase detector to provide a phase error indication of the PLL when the PLL is re-enabled but before closing the loop in the PLL. The loop in the PLL is typically closed with a switch between the phase detector and the loop filter. The phase error indication is used to gate the clock signals to the reference frequency divider and a variable frequency (loop) divider to initially phase lock the PLL. However, a disadvantage of this solution is the length of time required for initial phase adjustment of the clock signals of the reference frequency divider and the variable frequency (loop) divider. A further disadvantage of this solution is that, after the initial phase adjustment is completed, phase error is introduced into the PLL when the loop in the PLL is closed using the switch.

Accordingly, there is a need for an improved phase synchronization circuit and method therefor for a PLL that provides a rapid and accurate phase adjustment for the PLL with minimum hardware and minimum introduction of phase error to the PLL.

DETAILED DESCRIPTION OF THE PREFERRED EMBODIMENT

In accordance with the present invention, the foregoing need is substantially met by an improved phase synchronization circuit and method therefor for a phase locked loop. Each of a divided reference frequency signal and a feedback signal are held in a predetermined state. The divided reference frequency signal is enabled responsive to the phase of a reference frequency signal. A phase relationship between the reference frequency signal and an output frequency signal is determined. The feedback signal is then enabled responsive to enabling the divided reference frequency signal and the determined phase relationship. The present invention advantageously provides a rapid and accurate phase synchronization for the PLL with minimum additional hardware and without introducing phase errors to the PLL.

Figure 1:
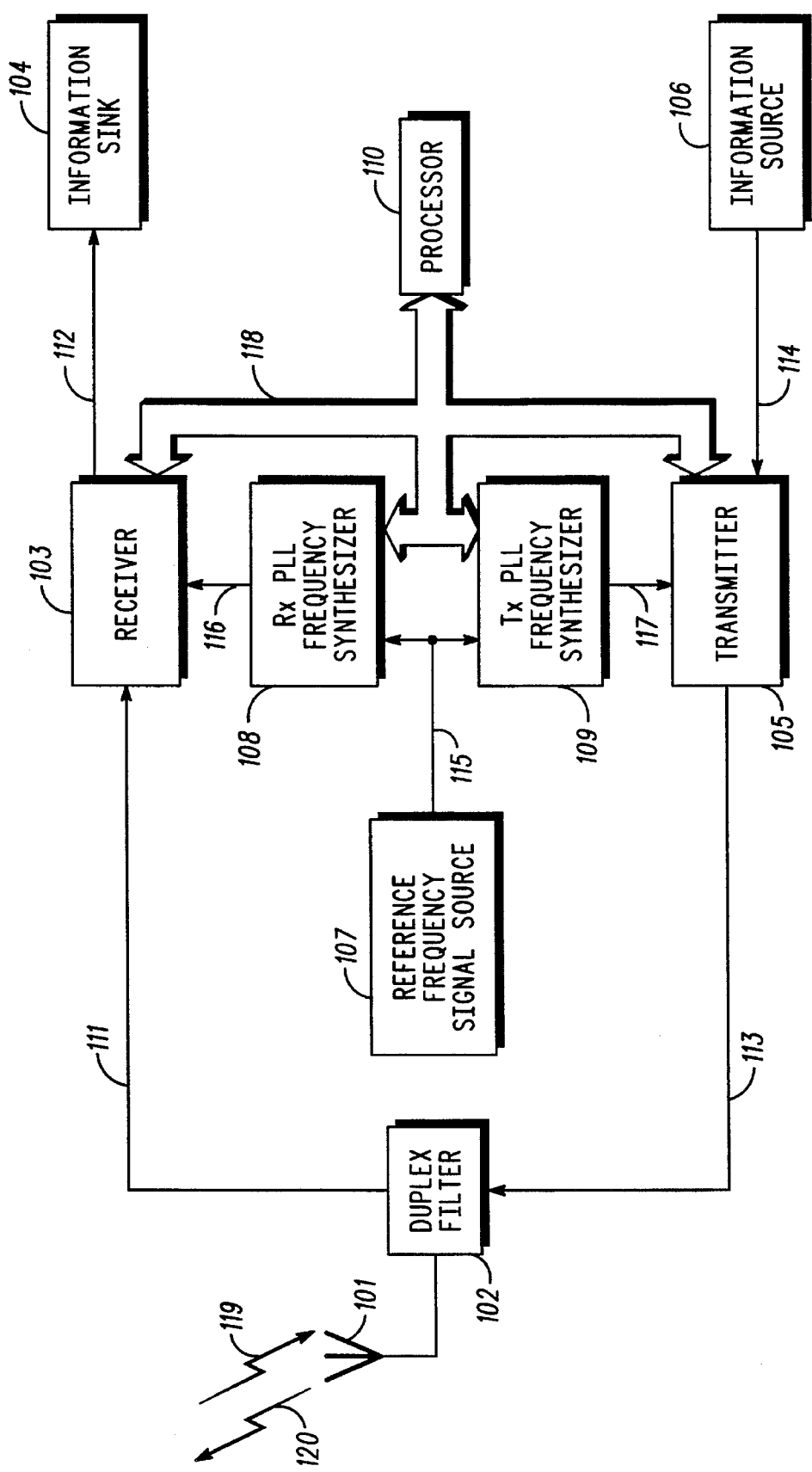
FIG. 1 illustrates a block diagram of a conventional radio communication transceiver.
Figure 2:
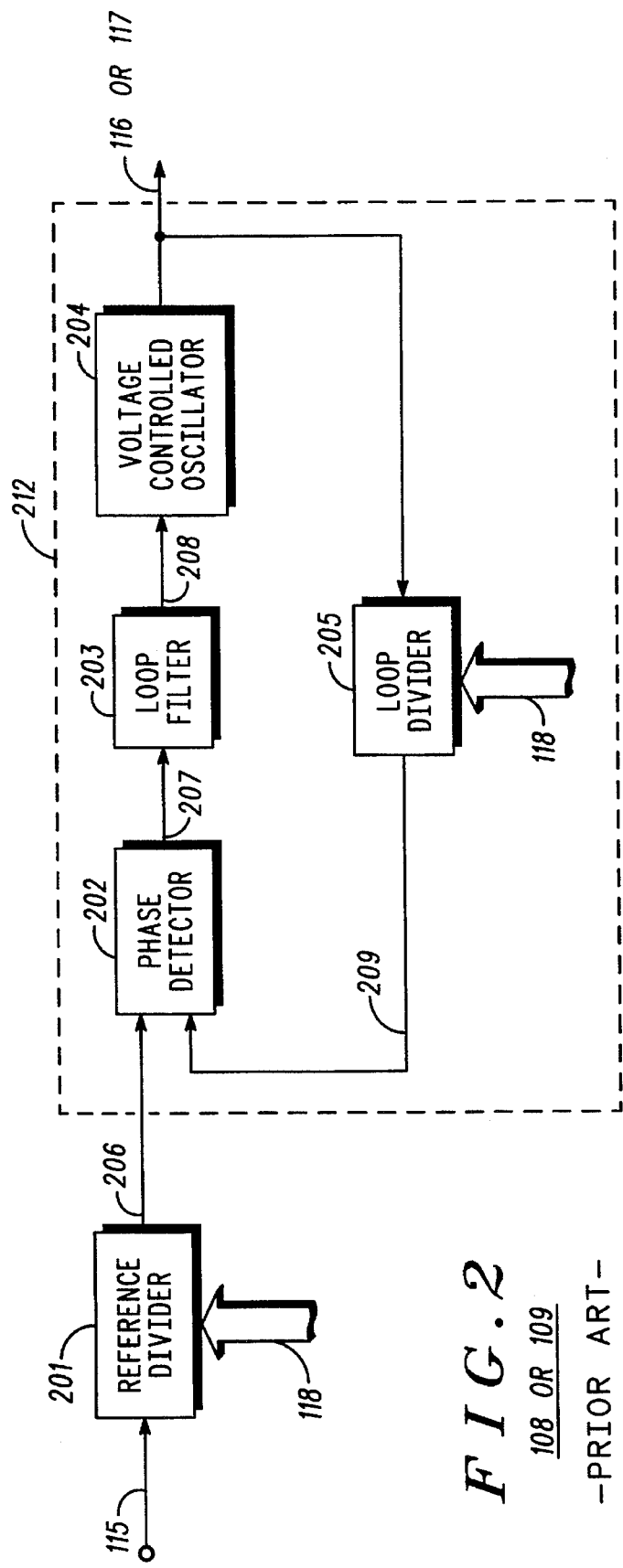
FIG. 2 illustrates a block diagram of a conventional phase locked loop frequency synthesizer for use in the radio communication transceiver of FIG. 1.
Figure 3:
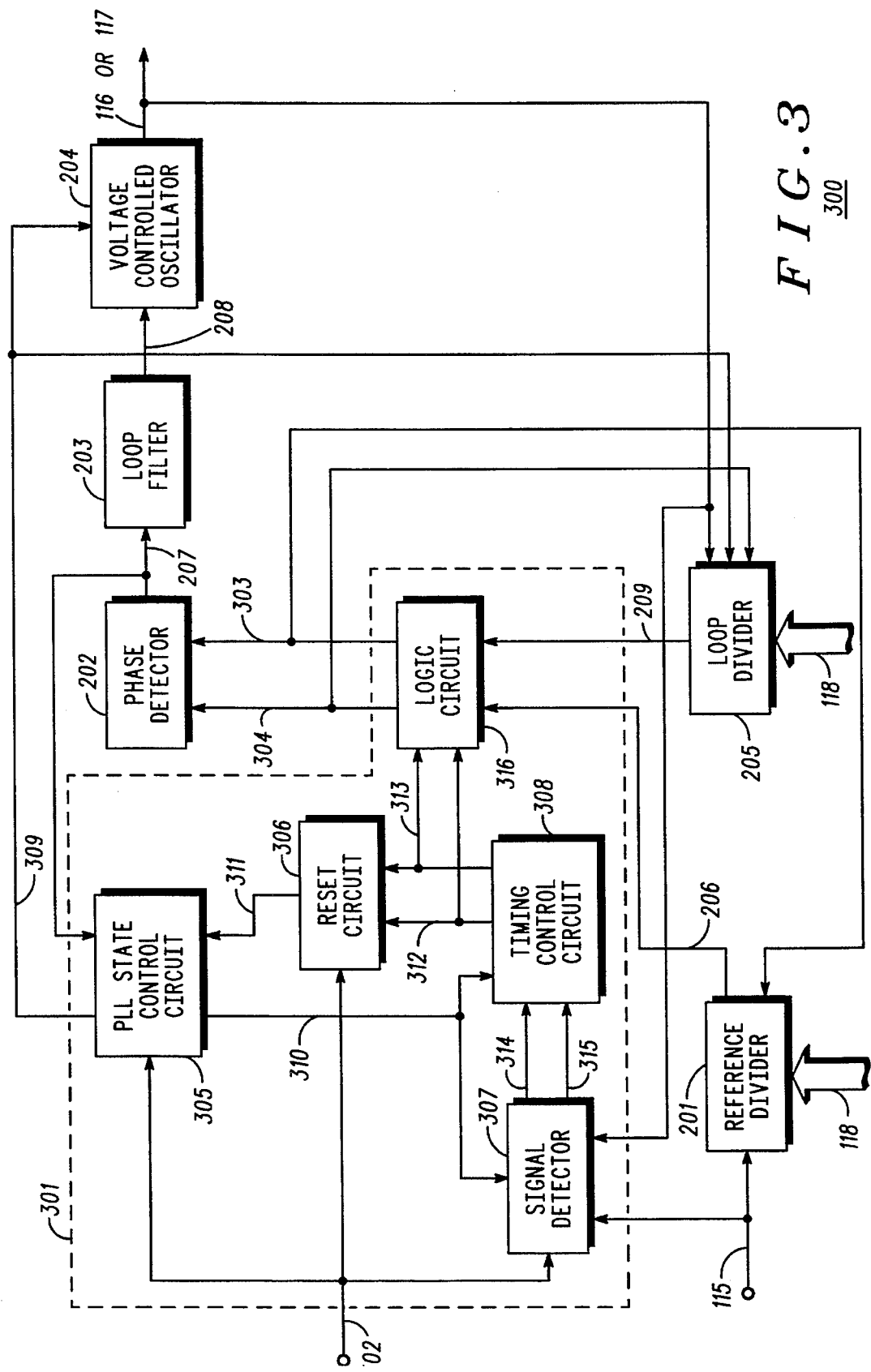
FIG. 3 illustrates a block diagram of a phase locked loop (PLL) frequency synthesizer for use in the radio communication transceiver of FIG. 1 in accordance with the present invention.

The present invention can be more fully described with reference to FIGS. 3–6, wherein FIG. 3 illustrates a block diagram of a phase locked loop (PLL) frequency synthesizer for use in the radio communication transceiver of FIG. I in accordance with the present invention. The PLL 300 in FIG. 3 has substantially the same structure and operates in the same manner as the prior art PLL 212 with the exception of a novel apparatus 301 and the associated method therefor. Therefore, in the preferred embodiment of the present invention, the novel PLL 300 is substituted for the prior art PLL 212 for use in the RX PLL frequency synthesizer 108 or in the Rx PLL frequency synthesizer 109 in the transceiver 100 of FIG. 1. One of ordinary skill in the art of PLL design and application may find other applications for the novel PLL 300 both inside and outside the radio communications field.

The novel PLL circuit 300 generally includes a phase detector 202, a loop filter 203, a voltage controlled oscillator (VCO) 204, a loop divider 205, and a novel phase synchronization circuit 301. Individually, the phase detector 202, the loop filter 203, the VCO 204, mud the loop divider 205 are generally well known in the art; thus, no further discussion will be presented except to facilitate the understanding of the present invention. The novel phase synchronization circuit 301 will be described and illustrated below with reference to FIGS. 3–6, in accordance with the present invention.

The novel PLL 300, with the exception of the novel phase synchronization circuit 301, may be implemented, for example, using a Motorola MC145170 PLL frequency synthesizer and a Motorola MC1648 voltage controlled oscillator. The loop filter 205 may be implemented, for example, with standard resistors and capacitors in accordance with well known filter design techniques.

Generally, the novel PLL 300 operates as follows. The novel PLL 300 generates an output frequency signal 116 or 117 responsive to a reference frequency signal 115. The output frequency signal 116 or 117 and the reference frequency signal 115 are each characterized by frequency and phase. The output frequency signal 116 or 117 has a higher frequency than the reference frequency signal 115. The frequency of the reference frequency signal 115 is divided to produce a divided reference frequency signal 206, and the frequency of the output frequency signal 116 or 117 is divided to produce a feedback signal 209. A phase error is indicative of the difference between the phase of the reference frequency signal 115 and the phase of the output frequency signal 116 or 117. The PLL 300 is operative to reduce the phase error responsive to a periodic indication of the phase error 207. The PLL 300 has a first and a second state responsive to a request signal 302. The occurrence of the request signal 302 is not synchronized in time with the periodic indication of the phase error 207.

The indication of the phase error 207 indicative of the difference between the phase of the reference frequency signal 115 and the phase of the output frequency signal 116 or 117. The indication of the phase error 207 may be produced by the phase detector 202, and may be in the form of a digital signal having an adjustable pulse width.

The periodic indication of the phase error 207 occurs, on average, at the same rate as the divided reference frequency signal 206. When the indication of the phase error 207 is active, the phase error information is coupled to the loop filter 203.

In the preferred embodiment, the first and the second states of the PLL 300 are the enabled and the disabled states of the PLL 300, respectively. In the preferred embodiment, the request signal 302 is produced by the processor 110 to indicate the desired PLL state in the operation of the radio transceiver 100. The request signal 302 may arrive at any time during the PLL 300 operation, including when the indication of the phase error 207 is active.

The interconnections between the novel phase synchronization circuit 301 and the conventional PLL loop 212 to form the novel PLL 300 are as follows. The phase synchronization circuit 301 is coupled to receive the divided reference frequency signal at line 206, the feedback signal at line 209, the output frequency signal at line 116 or 117, the reference frequency signal at line 115, the indication of phase error signal at line 207, and a request signal at line 302. The novel phase synchronization circuit 301 produces a PLL state control signal at line 309, a synchronized divided reference frequency signal at line 303, and a synchronized feedback signal at line 304.

The phase synchronization circuit 301 further comprises a PLL state control circuit 305, a signal detector 307, a timing control circuit 308, a logic circuit 316, and a reset circuit 306. Individually, the PLL state control circuit 305, the signal detector 307, the timing control circuit 308, the logic circuit 316, and the reset circuit 306 are well known in the art, and hence no additional description need be provided here except as may be necessary to facilitate the understanding of the present invention. The combination of the PLL state control circuit 305, the signal detector 307, the timing control circuit 308, the logic circuit 316, and the reset circuit 306 are considered to be novel elements of the present invention and will be described in further detail below.

Figure 6:
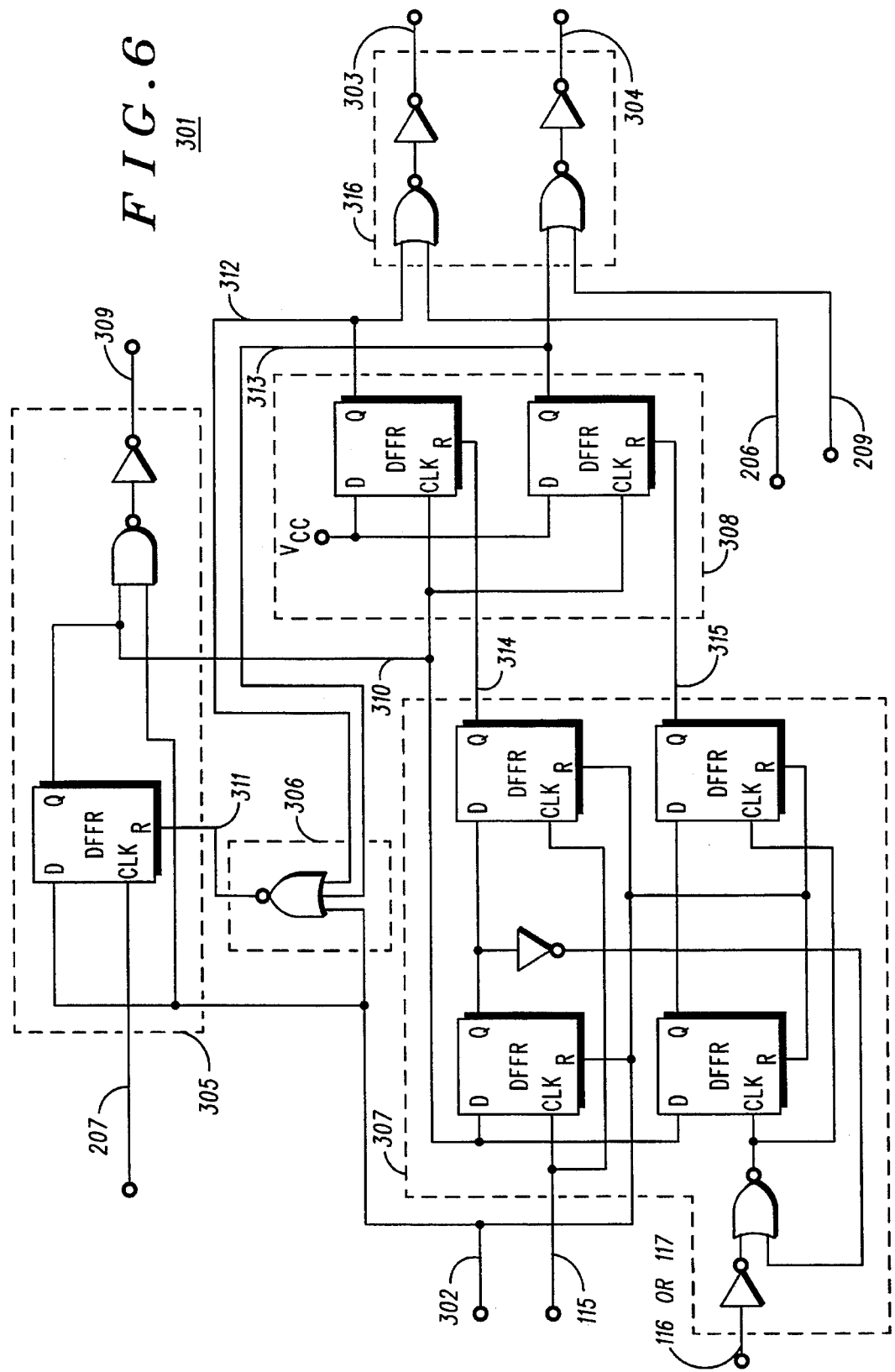
FIG. 6 illustrates a circuit implementation of the phase synchronization circuit in the PLL frequency synthesizer of FIG. 3 in accordance with the present invention.

The PLL state control circuit 305, the signal detector 307, the timing control circuit 308, the logic circuit 316, and the reset circuit 306 may be implemented, for example, using standard logic elements. Such logic elements may include, for example, NAND gates as a Motorola MC74HC00, NOR gates such as a Motorola MC74HC02, and D-type flip-flops such as a Motorola MC74HC74 in accordance with well known logic design techniques. FIG. 6 illustrates, by example, a circuit implementation of the phase synchronization circuit 301 in the PLL 300 of FIG. 3 in accordance with the preferred embodiment of the present invention.

The interconnections between the blocks of the novel phase synchronization circuit 301 are as follows. The PLL state control circuit 305 is coupled to receive a request signal 302, an indication of the phase error 207, and a first reset signal 311, and operative to produce a set signal 310 and a PLL state control signal 309. The PLL state control signal 309 controls a first and a second states of the PLL.

The signal detector 307 is coupled to receive the request signal 302, the output frequency signal 116 or 117, the reference frequency signal 115, and the set signal 310, and operative to produce second and third reset signals 314 and 315, respectively. The set signal 310 prepares the signal detector 307 to detect a first state of the request signal 302. The timing control circuit 308 is coupled to receive the second and third reset signals 314 and 315, respectively, and the set signal 310, and operative to produce first and second timing signals 312 and 313, respectively. The set signal 310 holds each of the first and second timing signals 312 and 313, respectively, in a predetermined state, and the second and third reset signals 314 and 315, respectively, releases the first and second timing signals 312 and 313, respectively, from their respective predetermined states.

The reset circuit 306 is coupled to receive the request signal 302 and the first and second timing signals 312 and 313, respectively, and operative to produce the first reset signal 311. The first reset signal 311 prepares the PLL state control circuit 305 to detect a second state of the request signal 302.

The logic circuit 316 is coupled to receive the first and second timing signals 312 and 313, respectively, the divided reference frequency signal 206, and the feedback signal 209, and operative to produce a synchronized divided reference frequency signal 303 and a synchronized feedback signal 304. The first timing signal 312 and the divided reference frequency signal 206 are combined to produce the synchronized divided reference frequency signal 303. The second timing signal 313 and the feedback signal 209 are combined to produce the synchronized feedback signal 304.

The general operation of the novel phase synchronization circuit 301 is as follows. According to the present invention, the PLL state control circuit 305, the logic circuit 316, the reset circuit 306, and associated method therefor control the state of the PLL and hold the divided reference frequency signal 206 and the feedback signal 209 in a predetermined state. The timing control circuit 308, the signal detector 307, the logic circuit 316, and the associated method therefor provide the timing control for the divided reference frequency signal 206. The signal detector 307 and associated method therefor determines the relative phase of the reference frequency signal 115 and the output frequency signal 116 and 117. The timing control circuit 308, the signal detector 307, the logic circuit 316 and the associated method therefor provide the timing control for the feedback signal 209. A more detailed description of the operation of the novel phase synchronization circuit 301 is provided below with reference to FIGS. 4 and 5.

The purpose of the novel phase synchronization circuit 301 is to minimize the phase error introduced into the PLL when operating between the first and the second states. The novel phase synchronization circuit 301 advantageously synchronizes the phase of the divided reference frequency signal 206 and the feedback signal 209, such that the time required for the PLL 300 to reach a locked condition is minimized after the PLL 300 switches from the second to the first state.

The novel phase synchronization circuit 301 advantageously minimizes the phase error introduced into the PLL by the elimination of a prior art switch between the phase detector and the loop filter, and by the use of the PLL state control circuit 305 which controls the timing of the PLL state transition. In addition, the novel phase synchronization circuit 301 advantageously minimizes the time required for the PLL 300 to reach a locked condition by adjusting the initial phases of the divided reference frequency signal 206 and the feedback signal 209 such that an accurate measurement of phase error can be accomplished as soon as the PLL 300 is operating in the first state. The initial phase adjustment recreates the sequence of events following the natural behavior of the divided reference frequency signal 206 and the feedback signal 209 when the PLL 300 is locked.

Within the scope of the present invention, alternative interconnections between the novel phase synchronization circuit 301 and the conventional PLL 212 may be implemented to form the novel PLL 300. The PLL state control circuit 305 may alternatively be coupled to receive the divided reference frequency signal 206 and the feedback signal 209 in place of the indication of the phase error 207 to determine another form of the indication of the phase error. The PLL state control signal 309 may alternatively be coupled to other elements of the PLL 300 to control the PLL 300 in accordance with well known design techniques. For example, the PLL state control signal 309 may also control a prescaler (not shown).

The PLL 300 of FIG. 3 may also include a charge pump and a prescaler (both not shown), as is well known in the art. The prescaler would be used between the VCO 204 and the loop divider 205 in the feedback path at line 116 or 117 to permit higher the loop divider 205 to accept higher input frequencies from the VCO 204. The charge pump would be used at the output of the phase detector 202 to provide high DC loop gain for the PLL 308.

According to the preferred embodiment of the present invention, the PLL state is controlled by the PLL state control circuit 305, the logic circuit 316, and the reset circuit 306. The set signal 310 prepares the signal detector 307 and the timing control circuit 308 for further action when the request signal changes state. Furthermore, the first reset signal 311 and the set signal 310 communicate the operational status of elements within the phase synchronization circuit 301. The operational status of the elements within the phase synchronization circuit 301 and the indication of phase error 207 advantageously provide the timing control of the PLL state control signal 309 to enable the PLL 300 to switch between the first and second states without introducing phase errors into the PLL 300.

According to the preferred embodiment of the present invention, the detection and adjustment of the relative phase of the reference frequency signal 115 and the output frequency signal 116 or 117 are accomplished very quickly by the signal detector 307, the timing control circuit 308, and the logic circuit 316. After both the reference frequency signal 115 and the output frequency signal 116 or 117 are detected, the signal detector 307 advantageously detects the phase of the reference frequency signal and determines the relative phase of the reference frequency signal 115 and the output frequency signal 116 or 117 within half a time period of the output frequency signal 116 or 117. Both the loop divider 205 and the reference divider 201 are enabled within one period of the reference frequency signal 115 after the determination of the relative phase. A further advantage is that the second and third reset signals 314 and 315 accurately adjust the initial phases of the synchronized divided reference frequency signal 303 and the synchronized feedback signal 304, respectively, in the timing control circuit 308, to produce an accurate phase error indication in subsequent PLL operation.

According to the preferred embodiment of the present invention, the timing control of the synchronized divided reference frequency signal 303 and the synchronized feedback signal 304 is provided by the timing control circuit 308. The first timing signal 312 is set by the set signal 310, and reset by the second reset signal 314. The second timing signal 313 is set by the set signal 310, and reset by the third reset signal 315. The timing control circuit 308 advantageously maintain the separation of the phase information for the synchronized divided reference frequency signal 303 and the synchronized feedback signal 304.

Figure 4:
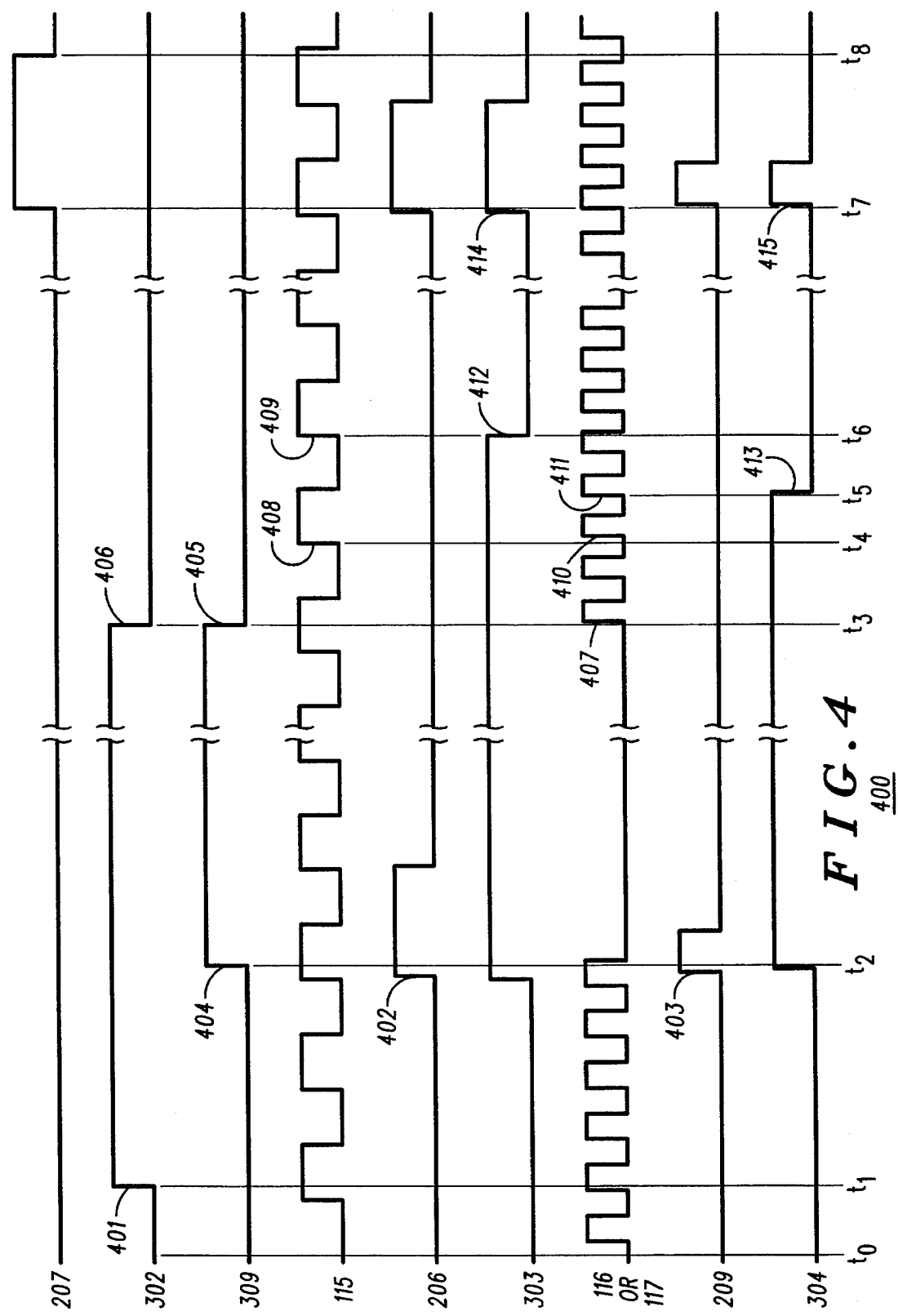
FIG. 4 is a timing diagram illustrating digital signals in a phase synchronization circuit in the PLL frequency synthesizer of FIG. 3 in accordance with the present invention.

FIG. 4 is a timing diagram illustrating digital signals in a phase synchronization circuit in the PLL frequency synthesizer of FIG. 3 in accordance with the present invention. The timing diagram includes the indication of phase error 207, the request signal 302, the PLL state control signal 309, the reference frequency signal 115, the divided reference frequency signal 206, the synchronized divided reference signal 303, the output frequency signal 116 or 117, the feedback signal 209, and the synchronized feedback signal 304.

The request signal 302 has a rising edge 401 and a falling edge 406. The PLL state control signal 309 has a rising edge 404 and a falling edge 405. The reference frequency signal 115 has rising edges 408 and 409. The divided reference frequency signal 206 has a rising edge 402. The synchronized divided reference frequency signal 303 has a rising edge 414 and a falling edge 412. The output frequency signal 116 or 117 has rising edges 407, 410, and 411. The feedback signal 209 has a rising edge 403. The synchronized feedback signal 304 has a rising edge 415 and a falling edge 413.

When the indication of phase error 207 is high, the PLL 300 responds to a phase error adjustment. When the request signal 302 is low, the PLL 300 requests to operate in the enabled state. When the request signal 302 is high, the PLL 300 requests to operate in the disabled state. When the PLL state control signal 309 is low, the PLL 300 operates in the enabled state. When the PLL state control signal 309 is high, the PLL 300 operates in the disabled state. When the synchronized divided reference frequency signal 303 is high, the reference divider 201 is in the reset state. When the synchronized divided reference frequency signal 303 is low, the reference divider 20 1 is enabled. When the synchronized feedback signal 304 is high, the loop divider 205 is in the reset state. When the synchronized feedback signal 304 is low, the loop divider 205 is enabled.

At time t0, the request signal 302 is low, and the PLL 300 operates in the enabled state.

At time t1, the request signal 302 switches to a high state. Since the rising edge 401 occurs when the indication of phase error 207 is low, the PLL state control circuit 305 disables the PLL 300 at rising edge 404.

At time t2, the PLL 300 operates in the disabled state after the arrival of both the rising edges 402 and 403. The synchronized divided reference frequency signal 303 and the synchronized feedback signal 304 are both held at the high state, and the output frequency signal 116 or 117 is turned off after time t2.

At time t3, the PLL state control circuit 305 enables the PLL at the falling edge 405 responsive to the falling edge 406. After detecting the rising edge 407, the signal detector 307 then detects the rising edge 408.

At time t4, the detection of the rising edge 408 allows the reference divider 201 to be enabled at the rising edge 409 at time t6. After the detection of the rising edge 408, the signal detector 307 also looks for the closest rising edge of the output frequency signal 116 or 117, and allows the loop divider 205 to be enabled at the next rising edge of the output frequency signal 116 or 117. In the timing diagram shown, the closest rising edge of the output frequency signal 116 or 117 is the rising edge 410. Therefore, the loop divider 205 is enabled at the rising edge 411.

At time t5, the loop divider 205 is enabled. The falling edge 413 is responsive to the rising edge 411. The PLL continues its normal enabled mode of operation after both the reference divider 201 and the loop divider 205 have been enabled.

At time t6, the reference divider is enabled. The falling edge 412 is responsive to the rising edge 409. The time difference between t5 and t6 closely resembles the time difference between the enabling of the loop divider 205 and the enabling of the reference divider 201 when the PLL 300 is locked under a normal PLL operation. Therefore, the phase error is accurately measured by the difference in arrival time of the divided reference frequency signal 206 and the feedback signal 209 at time t7.

At time t7, the rising edges 414 is shown to have arrived earlier than the rising edge 415, indicating a phase error. The indication of phase error 207 is high between time t7 and t8 to indicate the phase error. If the request signal becomes high between time t7 and t8, it will be ignored until after t8.

At time t8, the indication of phase error 207 goes low.

Figure 5:
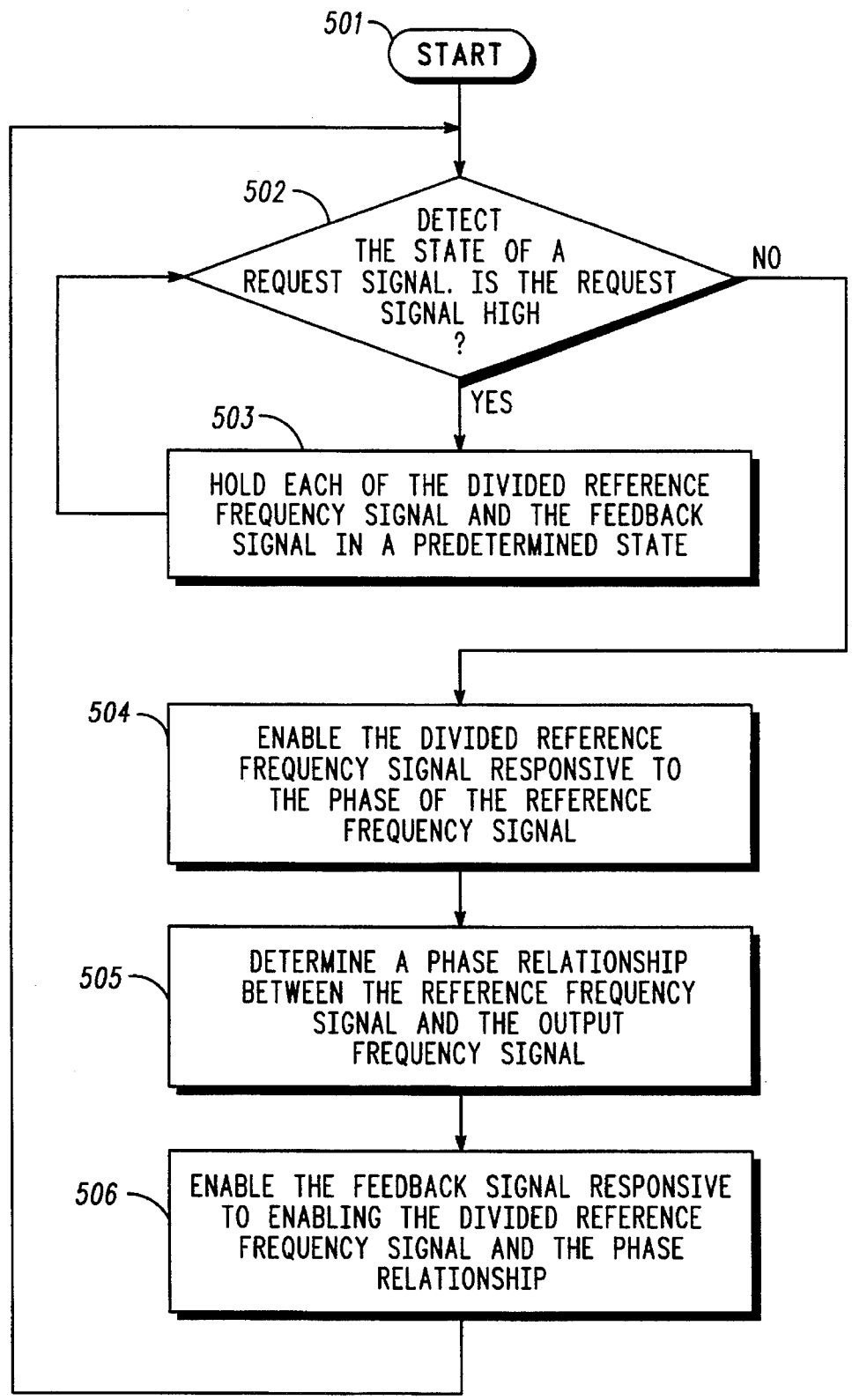
FIG. 5 illustrates a flow chart describing steps of synchronization for the PLL frequency synthesizer of FIG. 3 in accordance with the present invention.

FIG. 5 illustrates a flow chart describing steps of synchronization for the PLL frequency synthesizer of FIG. 3 in accordance with the present invention. The flow chart starts at step 501.

At step 502, the PLL state control circuit 305 detects the state of the request signal. If the state of the request signal is high, the flow chart proceeds to step 503.

At step 503, the PLL state control circuit 305 and the logic circuit 316 hold the divided reference frequency signal 206 and the feedback signal 209 in a predetermined state. The divided reference frequency signal 206 and the feedback signal 209 will be held at the predetermined state until the state of the request signal becomes low. If the state of the request signal is low, the flow chart proceeds to step 504.

At step 504, the divided reference frequency signal 206 is enabled responsive to the phase of the reference frequency signal 115.

At step 505, a phase relationship between the reference frequency signal 115 and the output frequency signal 116 and 117 is determined.

At step 506, the feedback signal 209 is enabled by the timing control circuit 308 and the logic circuit 316 responsive to enabling the divided reference frequency signal 206 and the phase relationship determined.

Thus, the present invention provides a phase synchronization circuit and method therefor for a phase locked loop 300. The present invention advantageously minimizes the phase error introduced into the PLL 300 when switching between states by eliminating a prior art switch between the phase detector and the loop filter. The PLL state control circuit 305 and the reset circuit 306 control the timing of the PLL state transition. In addition, the novel phase synchronization circuit 301 advantageously minimizes the time required for the PLL 300 to reach a locked condition by synchronizing the initial phases of the divided reference frequency signal 206 and the feedback signal 209. Therefore, accurate determination of phase error is accomplished as soon as the PLL 300 is enabled. With the present invention the problems of inaccurate phase adjustment, phase error generation into the PLL 300 with a loop switch, and the significant additional hardware of the prior art are substantially resolved.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. A phase synchronization circuit for a phase locked loop (PLL) that generates an output frequency signal responsive to a reference frequency signal, the output frequency signal and the reference frequency signal are each characterized by frequency and phase, the frequency of the reference frequency signal is divided to produce a divided reference frequency signal, the output frequency signal is divided to produce a feedback signal, a phase error is indicative of a difference between the phase of the reference frequency signal and the phase of the output frequency signal, the PLL is operative to reduce the phase error responsive to a periodic indication of the phase error, the PLL has a first and a second state responsive to a request signal, an occurrence of the request signal is not synchronized in time with the periodic indication of the phase error, the phase synchronization circuit for the PLL comprising:

a PLL state control circuit coupled to receive the request signal, the periodic indication of the phase error, and a first reset signal, and operative to produce a set signal and a PLL state control signal;

a signal detector coupled to receive the request signal, the output frequency signal, the reference frequency signal, and the set signal, and operative to produce second and third reset signals;

a timing control circuit coupled to receive the second and third reset signals, and the set signal, and operative to produce first and second timing signals;

a reset circuit coupled to receive the request signal and the first and second timing signals and operative to produce the first reset signal; and a logic circuit coupled to receive the first and second timing signals, the divided reference frequency signal, and the feedback signal, and operative to produce a synchronized divided reference frequency signal and a synchronized feedback signal.

2. A phase synchronization circuit according to claim 1 wherein the PLL state control signal controls the first and second states of the PLL.

3. A phase synchronization circuit according to claim 1 wherein the set signal prepares the signal detector to detect a first state of the request signal.

4. A phase synchronization circuit according to claim 1 wherein the set signal holds each of the first and second timing signals in a predetermined state, and wherein the second and third reset signals release the first and second timing signals, respectively, from their respective predetermined states.

5. A phase synchronization circuit according to claim 1 wherein the first reset signal prepares the PLL state control circuit to detect a second state of the request signal.

6. A phase synchronization circuit according to claim 1 wherein the first timing signal and the divided reference frequency signal are combined to produce the synchronized divided reference frequency signal, and wherein the second timing signal and the feedback signal are combined to produce the synchronized feedback signal.

7. In a phase locked loop (PLL) that generates an output frequency signal responsive to a reference frequency signal, the output frequency signal and the reference frequency signal are each characterized by frequency and phase, the output frequency signal has a higher frequency than the reference frequency signal, the frequency of the reference frequency signal is divided to produce a divided reference frequency signal, the frequency of the output frequency signal is divided to produce a feedback signal, the PLL having first and second states, a method for synchronizing the phase of the divided reference frequency signal and the phase of the feedback signal comprising the steps of:

holding each of the divided reference frequency signal and the feedback signal in a predetermined state;

enabling during the second state of the PLL, the divided reference frequency signal responsive to the phase of the reference frequency signal;

determining a phase relationship between the reference frequency signal and the output frequency signal; and enabling the feedback signal responsive to enabling the divided reference frequency signal and the determined phase relationship.

8. In a phase locked loop (PLL) that generates an output frequency signal responsive to a reference frequency signal, the output frequency signal and the reference frequency signal are each characterized by frequency and phase, the output frequency signal has a higher frequency than the reference frequency signal, the frequency of the reference frequency signal is divided to produce a divided reference frequency signal, the frequency of the output frequency signal is divided to produce a feedback signal, a phase error is indicative of a difference between the phase of the reference frequency signal and the phase of the output frequency signal, the PLL having a first and a second state responsive to a request signal, an occurrence of the request signal is not synchronized in time with a periodic indication of the phase error, a method for synchronizing the phase of the divided reference frequency signal and the phase of the feedback signal comprising the steps of:

detecting the request signal having first and second states corresponding to first and second states of the PLL;

when the detected requested signal is in the first state, holding each of the divided reference frequency signal and the feedback signal in a predetermined state; and when the detected requested signal is in the second state:
enabling the divided reference frequency signal responsive to the phase of the reference frequency signal;
determining a phase relationship between the reference frequency signal and the output frequency signal; and
enabling the feedback signal responsive to enabling the divided reference frequency signal and the determined phase relationship.

9. A radio frequency receiver includes a phase locked loop (PLL) frequency synthesizer operative to tune the radio frequency receiver to a radio frequency channel, the PLL frequency synthesizer includes a PLL capable of being enabled and disabled responsive to a request signal, the PLL generates an output frequency signal responsive to a reference frequency signal, the output frequency signal and the reference frequency signal are each characterized by frequency and phase, the frequency of the reference frequency signal is divided to produce a divided reference frequency signal, the output frequency signal is divided to produce a feedback signal, a phase error is indicative of a difference between the phase of the reference frequency signal and the phase of the output frequency signal, the PLL is operative to reduce the phase error responsive to a periodic indication of the phase error, an occurrence of the request signal is not synchronized in time with the periodic indication of the phase error, the radio frequency receiver comprising:

a receiver line up coupled to receive a radio frequency signal and operative to produce a received signal;

a processor coupled to receive the received signal and operative to produce the request signal responsive to the received signal; and a phase synchronization circuit in the PLL comprising:
a PLL state control circuit coupled to receive the request signal, the periodic indication of the phase error, and a first reset signal, and operative to produce a set signal and a PLL state control signal;

a signal detector coupled to receive the request signal, the output frequency signal, the reference frequency signal, and the set signal, and operative to produce second and third reset signals;

a timing control circuit coupled to receive the second and third reset signals, and the set signal, and operative to produce first and second timing signals;

a reset circuit coupled to receive the request signal and the first and second timing signals and operative to produce the first reset signal; and a logic circuit coupled to receive the first and second timing signals, the divided reference frequency signal, and the feedback signal, and operative to produce a synchronized divided reference frequency signal and a synchronized feedback signal.

10. A method of operating a radio frequency receiver including a phase locked loop (PLL) frequency synthesizer operative to tune the radio frequency receiver to a radio frequency channel, the PLL frequency synthesizer includes a PLL capable of being enabled and disabled responsive to a request signal, the PLL generates an output frequency signal responsive to a reference frequency signal, the output frequency signal has a higher frequency than the reference frequency signal, the output frequency signal and the reference frequency signal are each characterized by frequency and phase, the frequency of the reference frequency signal is divided to produce a divided reference frequency signal, the output frequency signal is divided to produce a feedback signal, a phase error is indicative of a difference between the phase of the reference frequency signal and the phase of the output frequency signal, the PLL is operative to reduce the phase error responsive to a periodic indication of the phase error, an occurrence of the request signal is not synchronized in time with the periodic indication of the phase error, a method of operating the radio frequency receiver comprising the steps of:

receiving a radio frequency signal to produce a received signal;

process the received signal to produce the request signal;

operating the radio frequency receiver responsive to the request signal, wherein the step of operating the radio frequency receiver further comprises the step of;

synchronizing the phase of the divided reference frequency signal and the phase of the feedback signal in the PLL, wherein the step of synchronizing further comprises the steps of:

detecting the request signal having first and second states corresponding to first and second states of the PLL;

when the detected requested signal is in the first state, holding each of the divided reference frequency signal and the feedback signal in a predetermined state; and when the detected requested signal is in the second state:

enabling the divided reference frequency signal responsive to the phase of the reference frequency signal;

determining a phase relationship between reference frequency signal and the output frequency signal; and enabling the feedback signal responsive to enabling the divided reference frequency signal and the determined phase relationship.

11. A phase locked loop (PLL) having a first and a second state responsive to a request signal, the PLL is operative to reduce a phase error responsive to a periodic indication of the phase error, an occurrence of the request signal is not synchronized in time with the periodic indication of the phase error, the PLL comprising:

a reference divider coupled to receive a reference frequency signal and a synchronized divided reference frequency signal, and operative to produce a divided reference frequency signal;

a phase detector coupled to receive the divided reference frequency signal and a feedback signal and operative to produce a phase error signal indicative of a phase difference between a phase of the reference frequency signal and a phase of an output frequency signal;

a loop filter coupled to receive the phase error signal and operative to produce a filtered signal;

a voltage controlled oscillator coupled to receive the filtered signal and a PLL state control signal, and operative to produce the output frequency signal;

a loop divider coupled to receive the output frequency signal, a synchronized feedback signal, and the PLL state control signal, and operative to produce the feedback signal; and a phase synchronization circuit comprising:

a PLL state control circuit coupled to receive the request signal, the periodic indication of the phase error, and a first reset signal, and operative to produce a set signal and the PLL state control signal;

a signal detector coupled to receive the request signal, the output frequency signal, the reference frequency signal, and the set signal, and operative to produce second and third reset signals;

a timing control circuit coupled to receive the second and third reset signals, and the set signal, and operative to produce first and second timing signals;

a reset circuit coupled to receive the request signal and the first and second timing signals and operative to produce the first reset signal; and a logic circuit coupled to receive the first and second timing signals, the divided reference frequency signal, and the feedback signal, and operative to synchronize the divided reference frequency signal and the feedback signal to produce the synchronized divided reference frequency signal and the synchronized feedback signal for coupling to the phase detector.

* * * * *